United States Patent
Kwon et al.

(10) Patent No.: US 11,515,324 B2
(45) Date of Patent: Nov. 29, 2022

(54) 3D NAND STRUCTURES WITH DECREASED PITCH

(71) Applicant: Applied Materials, Inc., Santa Clara, CA (US)

(72) Inventors: Thomas Kwon, Dublin, CA (US); Xinhai Han, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 146 days.

(21) Appl. No.: 16/720,643

(22) Filed: Dec. 19, 2019

(65) Prior Publication Data

US 2020/0203374 A1 Jun. 25, 2020

Related U.S. Application Data

(60) Provisional application No. 62/782,058, filed on Dec. 19, 2018.

(51) Int. Cl.
*H01L 27/1157* (2017.01)
*H01L 29/51* (2006.01)
*H01L 27/11582* (2017.01)

(52) U.S. Cl.
CPC .... *H01L 27/11582* (2013.01); *H01L 27/1157* (2013.01); *H01L 29/518* (2013.01)

(58) Field of Classification Search
CPC .......... H01L 27/11582; H01L 27/1157; H01L 21/28282; H01L 29/4234–42352; H01L 29/518; H01L 29/792–7926; H01L 27/115–11597; H01L 29/401–41741
See application file for complete search history.

(56) References Cited

U.S. PATENT DOCUMENTS

| | | |
|---|---|---|
| 5,500,256 A | 3/1996 | Watabe |
| 10,079,154 B1 * | 9/2018 | Le .................... H01L 21/31116 |
| 2009/0159002 A1 | 6/2009 | Bera et al. |
| 2013/0130468 A1 * | 5/2013 | Higashitani ......... H01L 27/1157 438/382 |
| 2014/0159142 A1 * | 6/2014 | Lim .................. H01L 29/42364 257/330 |
| 2015/0041879 A1 | 2/2015 | Jayanti et al. |
| 2015/0294980 A1 * | 10/2015 | Lee .................... H01L 29/7926 257/324 |

(Continued)

FOREIGN PATENT DOCUMENTS

| | | |
|---|---|---|
| JP | H0855802 A | 2/1996 |
| JP | 2001358135 A | 12/2001 |
| KR | 20100055617 A | 5/2010 |

OTHER PUBLICATIONS

PCT International Search Report and Written Opinion in PCT/US2019/050983 dated Jan. 28, 2020, 11 pages.

(Continued)

*Primary Examiner* — Stephen M Bradley
*Assistant Examiner* — Gustavo G Ramallo
(74) *Attorney, Agent, or Firm* — Servilla Whitney LLC (57) ABSTRACT

Methods of forming 3D NAND devices are discussed. Some embodiments form 3D NAND devices with increased cell density. Some embodiments form 3D NAND devices with decreased vertical and/or later pitch between cells. Some embodiments form 3D NAND devices with smaller CD memory holes. Some embodiments form 3D NAND devices with silicon layer between alternating oxide and nitride materials.

17 Claims, 9 Drawing Sheets

(56) References Cited

U.S. PATENT DOCUMENTS

| | | | |
|---|---|---|---|
| 2016/0071873 A1* | 3/2016 | Tsuji | H01L 27/11597 |
| | | | 257/324 |
| 2016/0086964 A1 | 3/2016 | Chien et al. | |
| 2016/0190154 A1* | 6/2016 | Nozawa | H01L 21/31144 |
| | | | 438/268 |
| 2016/0273108 A1 | 9/2016 | Ge et al. | |
| 2017/0062471 A1 | 3/2017 | Son et al. | |
| 2017/0103999 A1 | 4/2017 | Lee et al. | |
| 2017/0263715 A1* | 9/2017 | Bouche | H01L 21/0273 |
| 2017/0317194 A1* | 11/2017 | Tang | H01L 21/0228 |
| 2017/0373079 A1* | 12/2017 | Sharangpani | H01L 27/11524 |
| 2018/0138190 A1 | 5/2018 | Yasuda | |
| 2018/0269215 A1* | 9/2018 | Chiang | H01L 27/11582 |
| 2018/0274101 A1* | 9/2018 | Kano | C23C 16/45544 |
| 2018/0323212 A1 | 11/2018 | Daycock et al. | |
| 2019/0096904 A1* | 3/2019 | Noguchi | H01L 21/31111 |
| 2020/0127002 A1* | 4/2020 | Park | H01L 27/11556 |

OTHER PUBLICATIONS

PCT International Search Report and Written Opinion in PCT/US2019/067416 dated Apr. 24, 2020, 10 pages.

* cited by examiner

3D NAND STRUCTURES WITH DECREASED PITCH

CROSS-REFERENCE TO RELATED APPLICATIONS

This application claims priority to U.S. Provisional Application No. 62/782,058, filed Dec. 19, 2018, the entire disclosure of which is hereby incorporated by reference herein.

TECHNICAL FIELD

Embodiments of the present disclosure generally relate to methods for forming 3D NAND devices with decreased vertical and/or lateral pitch between cells. Some embodiments of the present disclosure allow for decreased CD of memory hole features.

BACKGROUND

As semiconductor technology advances, the market demands increasing smaller chips with increasingly more structures per unit area. One class of devices which has seen many advances in miniaturization are memory devices. As the demand for higher density increases, the typical approach in 3D NAND devices has been to stack more layers. Yet additional layers result in thicker stacks which are increasingly difficult to etch due to increasing aspect ratios. Accordingly, one solution has been to decrease the vertical pitch between layers so that total stack height does not increase.

Yet with thinner layers, cross-talk between neighboring cells has become an issue. Cross-talk can lead to poor device performance and largely defeat the benefits of the increased chip density. One way to reduce cross-talk is to increase the surface area of charge-trap layers. Therefore, there is a need for methods of increasing the surface area of charge-trap layers without increasing vertical pitch between cells.

Another potential solution for increasing density is to place memory devices closer together laterally or reduce lateral pitch. This solution is complicated by the required critical dimension (CD) of the memory hole or channel. If the CD of the memory hole can be reduced, then cells can be moved closer together without decreasing performance. Therefore, there is a need for methods of decreasing the CD of memory holes in 3D NAND devices.

SUMMARY

One or more embodiments of the disclosure are directed to a method of forming a 3D NAND device. The method comprises depositing a plurality of alternating layers of a nitride material and an oxide material separated by a silicon layer. A memory hole is etched with a width through the plurality of alternating layers to form an exposed surface of the alternating layers. A portion of the nitride material is selectively etched. A blocking oxide layer, a charge trap nitride layer and a gate oxide layer are deposited in the memory hole to form a liner on the exposed surfaces of the alternating layers. A silicon material is deposited to fill the memory hole. A slit is etched through the alternating layers. The nitride material is removed to expose the silicon layers and form a gap. The silicon layers are removed to expose layers of oxide material. A metal gate material is deposited to fill the gap between layers of the oxide material.

Additional embodiments of the disclosure are directed to a method for increasing cell density in 3D NAND devices. The method comprises etching a memory hole through a plurality of alternating layers of nitride material and oxide material to form an exposed surface of the alternating layers. A portion of the nitride material is selectively etched. A blocking oxide layer, a charge trap nitride layer and a gate oxide layer are deposited in the memory hole to form a conformal liner on the exposed surfaces of the alternating layers. A silicon material is deposited to fill the memory hole. The nitride material is replaced with a metal gate material.

Further embodiments of the disclosure are directed to a method for reducing interfacial SiON in 3D NAND devices. The method comprises forming a plurality of alternating layers of a nitride material and an oxide material by a cycle. The cycle comprises depositing a layer of a nitride material; depositing a first layer of silicon material; depositing a layer of oxide material; and depositing a second layer of silicon material. The cycle is repeated to form a predetermined number of layers. A 3D NAND device is formed.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process routines set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer may also be described as the substrate surface. The composition of a given substrate surface will depend on the materials to be deposited, as well as the particular chemistry used.

The disclosure herein utilizes terms such as "vertical", "horizontal", "lateral" and the like. As used herein, "vertical" refers to the plane which extends from close to the substrate to a point or plane distant from the substrate. As illustrated in the attached figures, the vertical plane runs from the top of the 3D NAND device (top of the page) to the substrate (bottom of the page). Similarly, "horizontal" refers to the plane which extends from one side of the substrate to the other. As illustrated in the attached figures, the horizontal plane runs from the left of the 3D NAND device (left of the page) to the right of the 3D NAND device (right of the page). Accordingly, "lateral" should be understood as moving from left to right or vice versa, i.e. horizontally. The skilled artisan will recognize that the directional descriptions are relative to the orientation of the 3D NAND device and are not limited to any particular substrate orientation.

As used in this specification and the appended claims, the term "selectively" refers to process which acts on a first surface with a greater effect than another second surface. Such a process would be described as acting "selectively" on the first surface over the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

Some embodiments of the present disclosure relate to methods for forming a 3D NAND device. Some embodiments of the disclosure advantageously provide for methods of forming 3D NAND devices with increased cell density. Some embodiments of the disclosure advantageously provide for methods of forming 3D NAND devices with decreased vertical pitch. Some embodiments of the disclosure advantageously provide for methods of forming 3D NAND devices with decreased lateral pitch. Some embodiments of the disclosure advantageously provide methods for forming 3D NAND devices with reduced memory hole CD. Additional embodiments of the disclosure provide methods for forming 3D NAND devices with reduced interfacial SiON between neighboring oxide and nitride layers.

Figure 1:
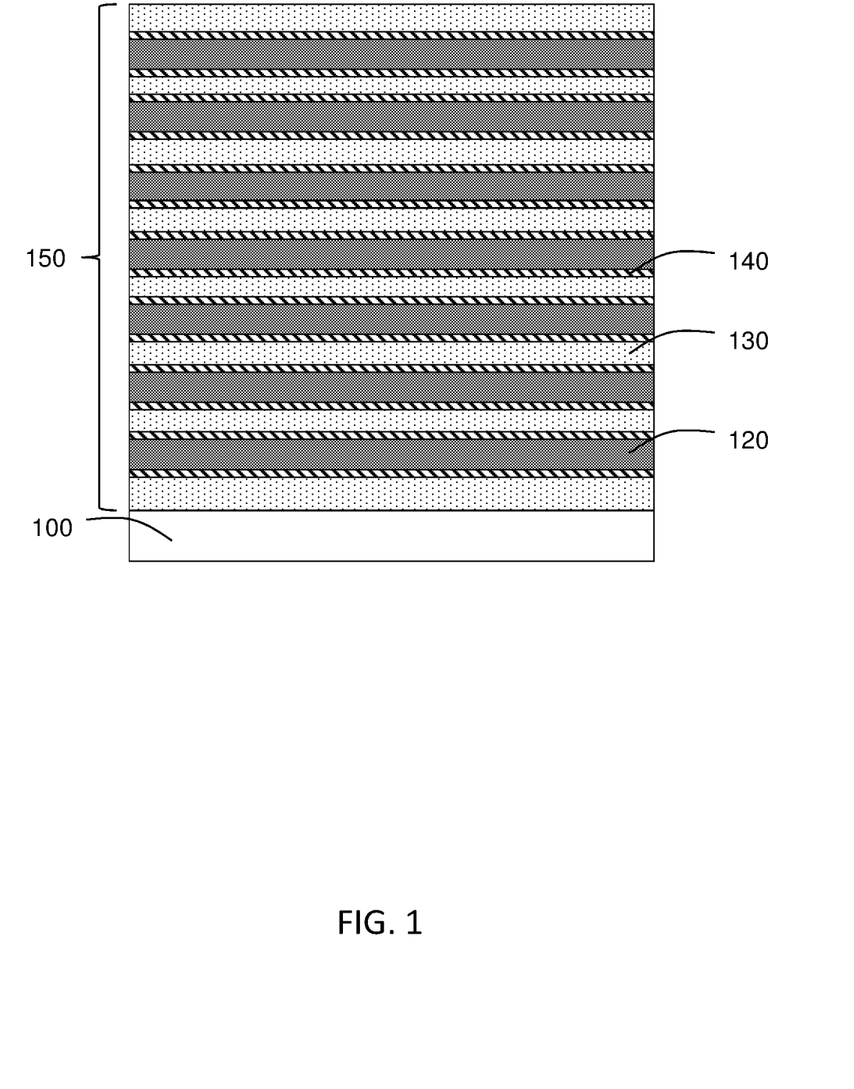
FIG. 1 illustrates a cross-sectional view of an exemplary substrate with alternating layers according to one or more embodiments described herein.

Referring to the Figures, some embodiments of the disclosure relate to 3D NAND devices and methods for forming. FIG. 1 illustrates a cross-sectional view of an exemplary substrate 100 according to some embodiments of this disclosure. The methods begin by providing a substrate 100 to a processing chamber. A plurality of alternating layers 150 of a nitride material 120 and an oxide material 130 are deposited on the substrate 100. In some embodiments, as shown, the alternating layers 150 are separated by a silicon layer 140 between each layer of nitride material 120 and oxide material 130.

In some embodiments, the nitride material 120 comprises silicon nitride. In some embodiments, the oxide material 130 comprises silicon oxide. In some embodiments, the silicon layer 140 consists essentially of silicon. As will be understood by one skilled in the art, each of the nitride material 120 and the oxide material 130 may be stoichiometric or non-stoichiometric materials.

The alternating layers 150, including the nitride material 120, the oxide material 130 and/or the silicon layers 140 may be deposited by any suitable process. In some embodiments, each of the nitride material 120, the oxide material 130 and the silicon layers 140 are deposited by chemical vapor deposition.

The individual alternating layers may be formed to any suitable thickness. In some embodiments, the thickness of each layer of nitride material 120 is approximately equal. In some embodiments, the thickness of each layer of oxide material 130 is approximately equal. In some embodiments, the thickness of each silicon layer 140 is approximately equal. As used in this regard, thicknesses which are approximately equal are within +/−5% of each other.

In some embodiments, the average thickness of the layers of nitride material 120 is approximately equal to the average thickness of the layers of oxide material 130. In some embodiments, the average thickness of the layers of nitride material 120 is greater than or less than the average thickness of the layers of oxide material 130.

In some embodiments, a silicon layer 140 is deposited on each layer of nitride material 120 and each layer of oxide material 130. Stated differently, a silicon layer 140 is deposited between a layer of nitride material 120 and a layer of oxide material 130.

In some embodiments, the thickness of the silicon layer 140 may be relatively thin as compared to the thickness of a layer of nitride material 120 or a layer of oxide material 130. In some embodiments, the thickness of the silicon layer 140 is less than or equal to about 20%, less than or equal to about 10%, less than or equal to about 5%, less than or equal to about 2%, or less than or equal to about 1% of the average thickness of the layers of nitride material 120 and oxide material 130.

In some embodiments, the average thickness of the layers of nitride material 120 is about 27 nm. In some embodiments, the average thickness of the layers of oxide material 130 is about 25 nm. In some embodiments, the average thickness of a silicon layer is about 3 nm. As used in this regard, a layer which is "about X nm" includes variations of +/−5% of X.

Figure 2:
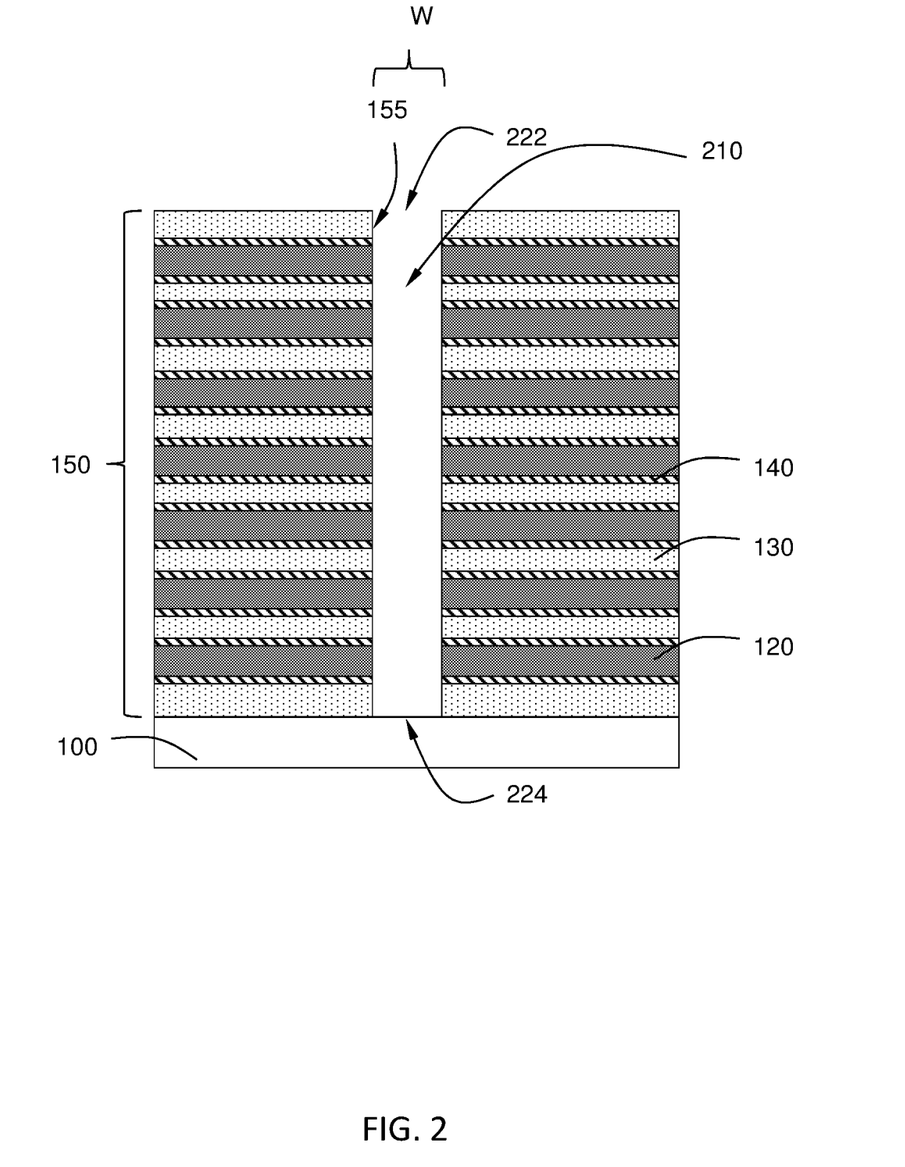
FIG. 2 illustrates a cross-sectional view of the exemplary substrate with a memory hole etched through the alternating layers according to one or more embodiments described herein.

Referring to FIG. 2, after the alternating layers 150 are deposited, a memory hole 210 is etched through the alternating layers 150. Etching the memory hole 210 forms an exposed surface 155 of the alternating layers 150. The memory hole 210 has a width W. In some embodiments, the width is approximately equal at the top 222 and bottom 224 of the memory hole 210. In some embodiments, the memory hole 210 has a width W of about 70 nm.

In some embodiments, the memory hole 210 is formed using a hardmask. In some embodiments, etching the memory hole is performed using a reactive ion etch process.

Figure 3:
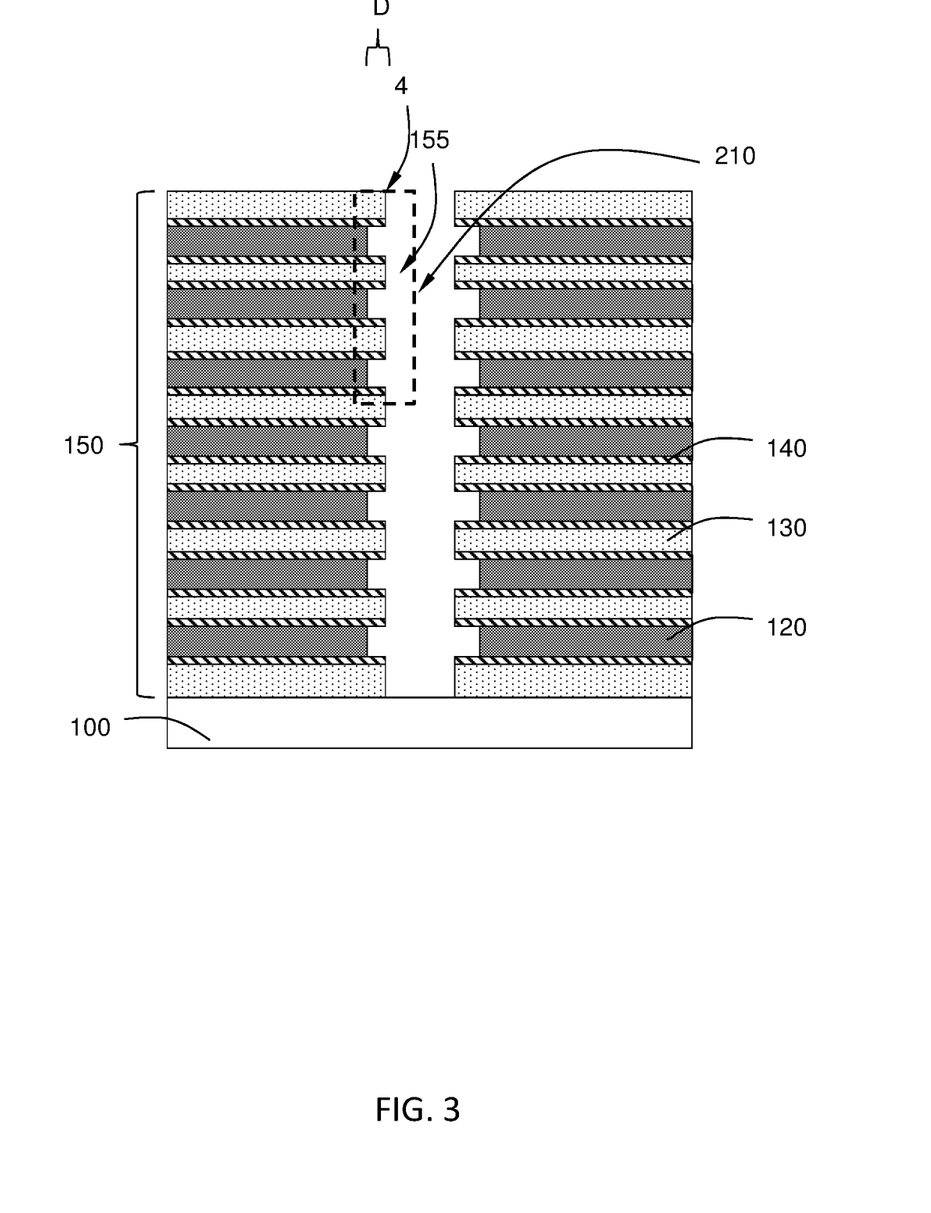
FIG. 3 illustrates a cross-sectional view of the exemplary substrate with the nitride material etched to a predetermined depth according to one or more embodiments described herein.

As shown in FIG. 3, after etching the memory hole 210, the layers of nitride material 120 are selectively etched from the exposed surface 155 of the alternating layers 150. Etching the nitride material 120 laterally removes a portion of the nitride material 120.

The amount of nitride material 120 removed may be controlled. In some embodiments, the nitride material 120 is selectively etched to remove a predetermined depth D of nitride material 120. As shown in FIG. 3, in some embodiments, the depth D of material removed from each layer of nitride material 120 is approximately equal.

The nitride material 120 may be selectively etched by any suitable process selective to the oxide material 130 and the silicon layer 140. In some embodiments, the nitride material may be selectively etched by an atomic layer etching process.

In some embodiments, the nitride material 120 is selectively etched to remove a depth D that is proportional to the width W of the memory hole 210. In some embodiments, the depth D is greater than or equal to about 2% of W, greater than or equal to about 5% of W, greater than or equal to about 10% of W, or greater than or equal to about 15% of W. In some embodiments, the depth D is less than or equal to about 30% of W, less than or equal to about 25% of W, less than or equal to about 20% of W, less than or equal to about 15% of W, or less than or equal to about 10% of W. In some embodiments, the depth D is in a range of about 2% to about 30% of W, in a range of about 5% to about 25% of W, or in a range of about 10% to about 20% of W.

In some embodiments, the depth D is less than or equal to about 10 nm, less than or equal to about 7 nm, less than or equal to about 5 nm, or less than or equal to about 3 nm. In some embodiments, the depth D is in a range of about 2 nm to about 10 nm or in a range of about 10 nm to about 15 nm. In some embodiments, the depth D is about 5 nm.

Figure 4:
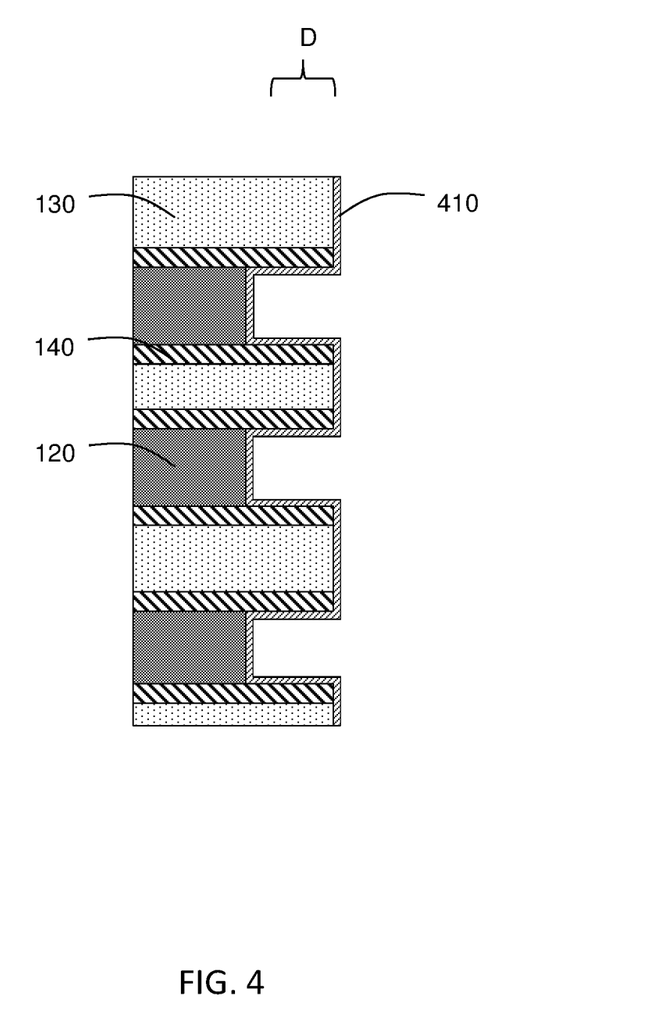
FIG. 4 illustrates an enlarged cross-sectional view of the exemplary substrate with a liner deposited in the memory hole according to one or more embodiments described herein.

FIG. 4 shows an enlarged view of region 4 shown in FIG. 3 after depositing a blocking oxide layer, a charge trap nitride layer and a gate oxide layer in the memory hole 210 to form a liner 410 on the exposed surface 155 of the alternating layers 150.

For simplicity, FIG. 4 and subsequent figures show the liner 410 without showing the individual component layers.

The blocking oxide layer is deposited in contact with the exposed surface 155 of the alternating layers 150. The charge trap nitride layer is deposited in contact with the blocking oxide layer. The gate oxide layer is deposited in contact with the charge trap nitride layer.

In some embodiments, the blocking oxide layer, the charge trap nitride layer and the gate oxide layer are each deposited by atomic layer deposition. In some embodiments, the atomic layer deposition process is a spatial atomic layer deposition process.

In some embodiments, the liner 410 is substantially conformal to the exposed surface 155 of the alternating layers 150. As used herein, a layer which is "substantially conformal" refers to a layer where the thickness is about the same throughout (e.g., on the top, middle and bottom of sidewalls and on the bottom of the gap). A layer which is substantially conformal varies in thickness by less than or equal to about 5%, 2%, 1% or 0.5%.

Without being bound by theory, it is believed that recessing the nitride material 120 provides a structure with variable depth such that when the liner 410 is deposited, the charge trap layer has a greater surface area in proximity to the nitride material 120 than a similar process performed on a structure without the variable depth. In theory, the increased surface area of the charge trap layer provides several benefits.

In some embodiments, recessing the nitride material 120 by about 5 nm allows for the vertical pitch between similar layers (i.e. between two oxide layers or two gate layers) to be reduced by about 25%. In some embodiments, recessing the nitride material 120 by about 5 nm allows the width W of the memory hole to be reduced by about 25%. Reducing the width W of the memory hole 210 allows for the lateral pitch between cells to be reduced by a similar amount. In some embodiments, reducing the width W of the memory hole 210 provides lower pass voltage. In some embodiments, the contoured liner and related increased surface area provides for higher charge retention.

Figure 5:
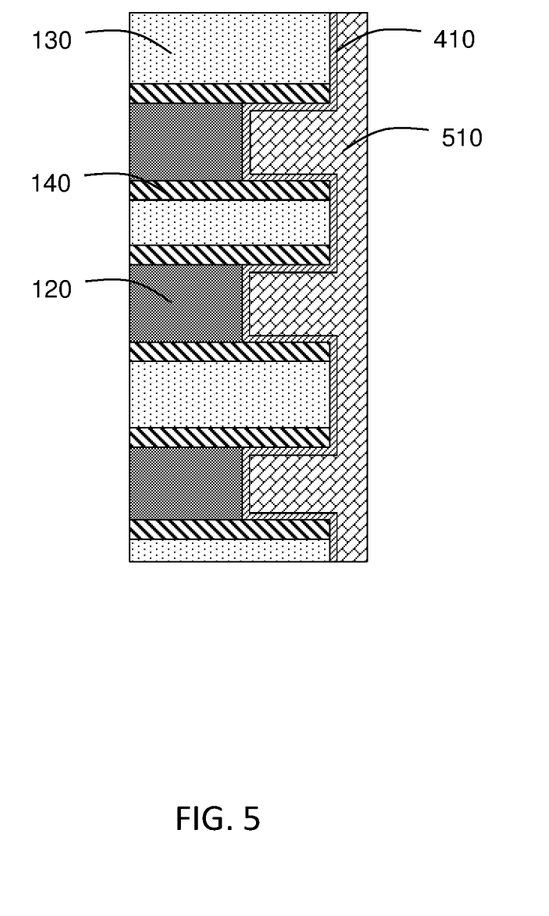
FIG. 5 illustrates an enlarged cross-sectional view of the exemplary substrate with a silicon material deposited in the memory hole according to one or more embodiments described herein.

As shown in FIG. 5, after depositing the liner 410, a silicon material 510 is deposited to fill the memory hole 210. In some embodiments, the silicon material 510 comprises a substantially crystalline silicon material. In some embodiments, the silicon material 510 comprises a monolithic crystalline material.

The silicon material 510 may be deposited by any suitable process. In some embodiments, the silicon material 510 is deposited by chemical vapor deposition (CVD). In some embodiments, the silicon material 510 is deposited by epitaxial deposition. In some embodiments, the silicon material 510 is deposited by a flowable CVD process.

While not shown in the figures, after depositing the silicon material 510, a slit is opened on the opposite side of the alternating layers 150 from the memory hole 210. In some embodiments, the slit is formed using a hardmask. In some embodiments, etching the slit is performed using a reactive ion etch process. In some embodiments, the slit is formed by a similar process to the process used to etch the memory hole 210.

Figure 6:
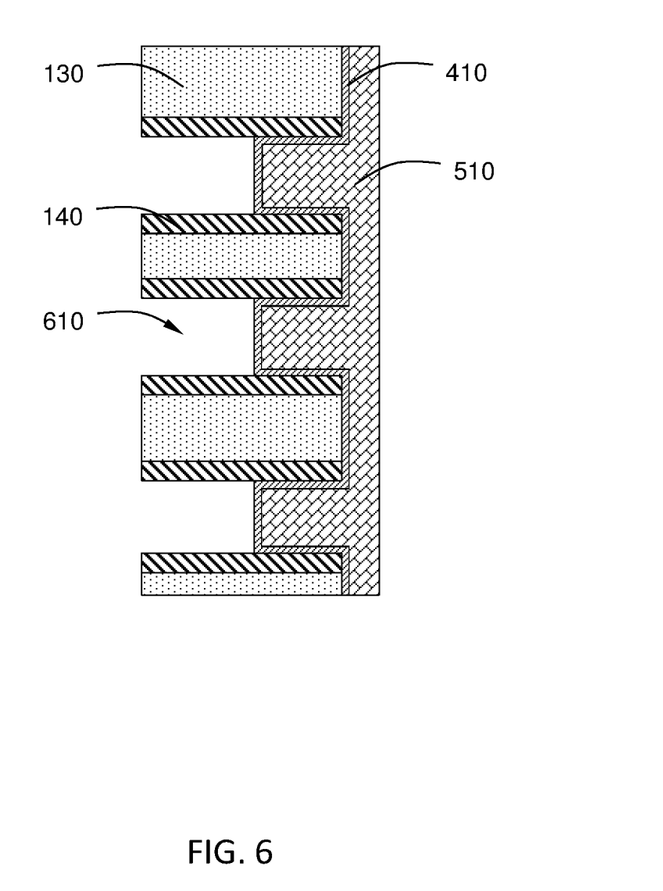
FIG. 6 illustrates an enlarged cross-sectional view of the exemplary substrate with the nitride material removed according to one or more embodiments described herein.

As shown in FIG. 6, after forming the slit, the nitride material 120 is removed to expose the silicon layers 140 and form a gap 610. The nitride material 120 may be removed by any suitable process. In some embodiments, the removal process is selective to the nitride material 120 over the silicon layers 140, the liner 410 and/or the oxide material 130. In some embodiments, the nitride material 120 is removed by hot phosphoric acid (hot phos).

Figure 7:
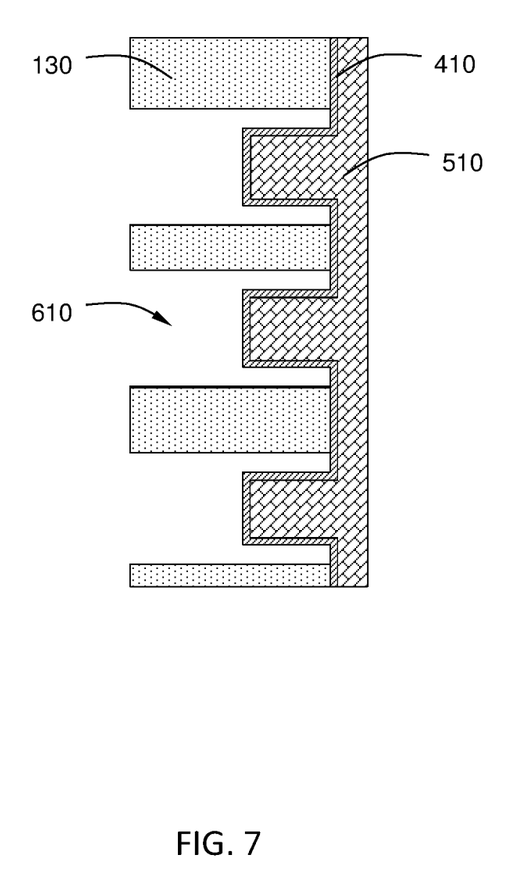
FIG. 7 illustrates an enlarged cross-sectional view of the exemplary substrate with the silicon layers removed according to one or more embodiments described herein.

As shown in FIG. 7, after removing the nitride material 120, the silicon layers 140 (if present) are removed. The silicon layers 140 may be removed by any suitable process. In some embodiments, the removal process is selective to the silicon layers 140 over the oxide material 130 and/or the liner 410. In some embodiments, the silicon layers 140 are removed by potassium hydroxide.

Figure 8:
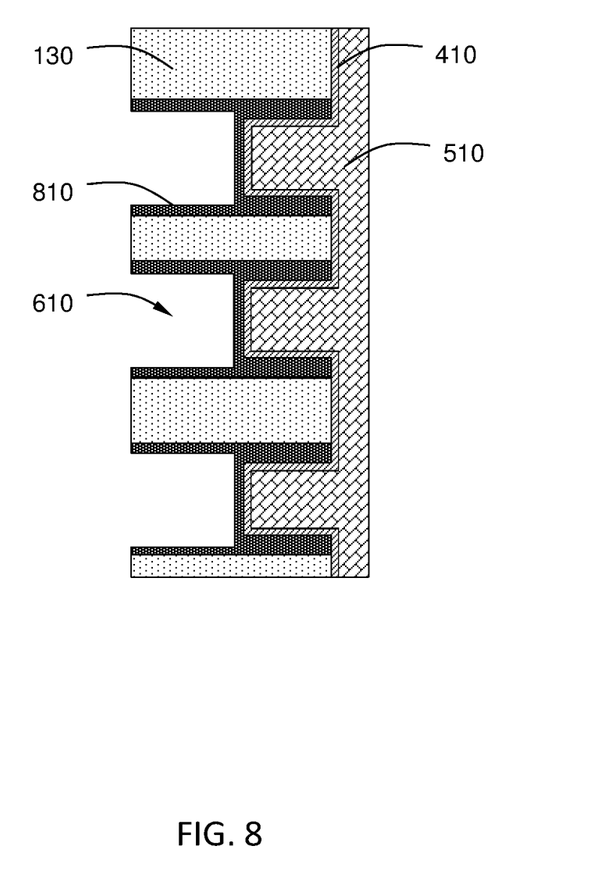
FIG. 8 illustrates an enlarged cross-sectional view of the exemplary substrate with a barrier layer deposited according to one or more embodiments described herein.

As shown in FIG. 8, after removing the silicon layers, if necessary, a barrier layer 810 may be deposited on the layers of oxide material 130. In some embodiments, the barrier layer 810 is not deposited. In some embodiments, the barrier layer 810 is deposited by atomic layer deposition. In some embodiments, the barrier layer 810 comprises titanium nitride.

Figure 9:
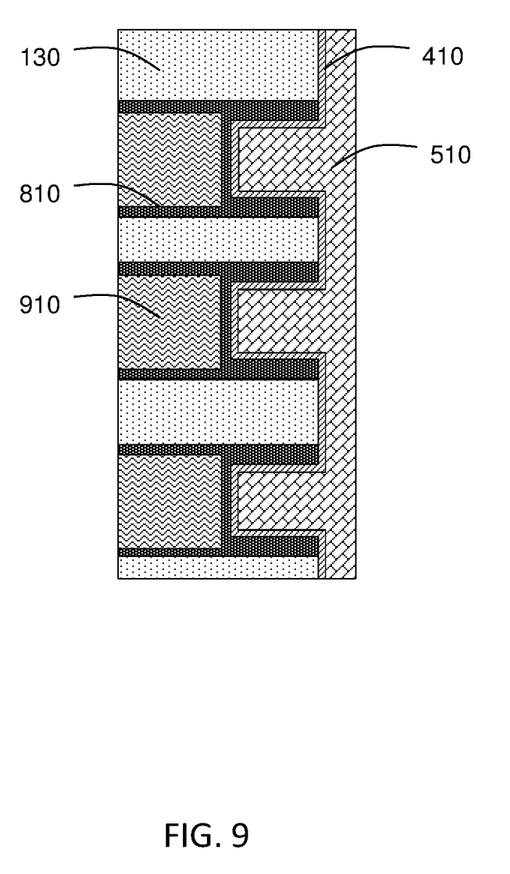
FIG. 9 illustrates an enlarged cross-sectional view of the exemplary substrate with a metal gate material deposited in the gap according to one or more embodiments described herein.

As shown in FIG. 9, after depositing the barrier layer 810, a metal gate material 910 is deposited to fill the gaps 610 between the layers of oxide material 130. The gate material 910 may be any suitable conductive material. In some embodiments, the gate material 910 comprises tungsten. In some embodiments, the gate material 910 is deposited by atomic layer deposition. In some embodiments, not shown, the layers of gate material 910 formed join together. In these embodiments, the layers of gate material 910 may be separated by a selective atomic level metal etch process.

Some embodiments of the disclosure relate to methods for increasing cell density in 3D NAND devices. The increased density may be achieved by reducing vertical cell pitch (the vertical distance between adjacent cells) and/or lateral cell pitch (the lateral distance between cells, usually measured across the memory hole).

In some embodiments, the methods comprise etching a memory hole through alternating layers of a plurality of alternating layers of nitride material and oxide material to form an exposed surface of the alternating layers; selectively etching a portion of the nitride material; depositing a blocking oxide layer, a charge trap nitride layer and a gate oxide layer in the memory hole to form a conformal liner on the exposed surface of the alternating layers; and depositing a silicon material to fill the memory hole. Similar processes are described above with reference to FIGS. 2-5.

After depositing the silicon material in the memory hole, the nitride material is replaced with a metal gate material. This replacement may be performed by any suitable process. In some embodiments, the replacement process is performed by a process similar to the process disclosed with reference to FIGS. 6-9. In some embodiments, the silicon layers removed with reference to FIG. 7 are not present. In these embodiments, the operation described with reference to FIG. 7 may be excluded.

Without being bound by theory, the conformal charge trap nitride layer in the disclosed embodiments has an increased surface area as a result of the etched nitride material as compared to embodiments where the nitride material is not etched. As described above, the increased surface area provides for reduced vertical pitch, reduced memory hole width, and/or reduced lateral pitch. Without being, bound by theory, the silicon layers disclosed above are not believed necessary to achieve these benefits. In some embodiments, the silicon layers 140 described elsewhere are not present.

Some embodiments of the disclosure relate to methods for reducing program disturbance. The reduced program disturbance of some embodiments may be achieved by reducing or eliminating oxynitride between oxide and nitride layers.

In some embodiments, the methods comprise forming a plurality of alternating layers of a nitride material and an oxide material by a cycle comprising: depositing a layer of a nitride material; depositing a first layer of silicon material; depositing a layer of oxide material; and depositing a second layer of silicon material. In some embodiments, the cycle is repeated to form a predetermined number of layers. The plurality of alternating layers formed by some embodiments is shown in FIG. 1.

In some embodiments, the plurality of alternating layers is formed into a 3D NAND device. In some embodiments, the process for forming a 3D NAND device comprises: etching a memory hole through the plurality of alternating layers; depositing a blocking oxide layer, a charge trap nitride layer and a gate oxide layer in the memory hole; depositing a silicon material to fill the memory hole; and replacing the nitride material with a metal gate material. In some embodiments, the process for forming a 3D NAND device is described with reference to FIGS. 2-9.

Without being bound by theory, it is believed that the silicon layer deposited between layers of nitride material and oxide material prevents the spontaneous formation of oxynitride. The oxynitirde is believed to be formed by the mingling of oxygen and nitrogen atoms at the interfacial surface between layers. In some embodiments, the deposition of a silicon layer between layers of silicon nitride and silicon oxide prevents the formation of silicon oxynitride (SiON).

Again, without being bound by theory, in some 3D NAND formation techniques, the layers of nitride material are replaced with gate materials. In these instances, the processes which remove the nitride material may not adequately remove all oxynitride material which formed at the interface of the oxide and nitride layers. Accordingly, this resistive layer may cause a voltage shift and programming disturbances in the final cell.

Some embodiments of the present disclosure relate to a 3D NAND device. Some embodiments of the disclosure advantageously provide for 3D NAND devices with increased cell density. Some embodiments of the disclosure advantageously provide for 3D NAND devices with decreased vertical pitch. Some embodiments of the disclosure advantageously provide for 3D NAND devices with decreased lateral pitch. Some embodiments of the disclosure advantageously provide 3D NAND devices with reduced memory hole CD. Additional embodiments of the disclosure provide 3D NAND devices with reduced interfacial SiON between neighboring oxide and nitride layers.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a 3D NAND device, the method comprising:
depositing a layer of an oxide material, a first silicon layer directly on the oxide material, a nitride material directly on the first silicon layer, and a second silicon layer directly on the nitride material;
repeating deposition of the oxide material, the first silicon layer, the nitride material and the second silicon layer to deposit a plurality of alternating layers of the nitride material and the oxide material;
etching a memory hole with a width through the plurality of alternating layers to form an exposed surface of the plurality of alternating layers;
selectively etching a portion of the nitride material;
depositing a blocking oxide layer, a charge trap nitride layer and a gate oxide layer in the memory hole to form a liner on the exposed surface of the plurality of alternating layers;
depositing a silicon material to fill the memory hole;
etching a slit through the plurality of alternating layers;
removing the nitride material to expose the first and second silicon layers and form a gap;
removing the first and second silicon layers to expose the layers of oxide material; and
depositing a metal gate material to fill the gap between the layers of oxide material.

2. The method of claim 1, wherein the plurality of alternating layers are deposited by chemical vapor deposition.

3. The method of claim 1, wherein a layer of the nitride material has a thickness of about 27 nm, the first and second silicon layers have a thickness of about 3 nm, and a layer of the oxide material has a thickness of about 25 nm.

4. The method of claim 1, wherein the width of the memory hole is about 70 nm.

5. The method of claim 1, wherein selectively etching a portion of the nitride material comprises an atomic layer etching process.

6. The method of claim 1, wherein the nitride material is etched to remove a depth in a range of about 10% to about 20% of the width of the memory hole.

7. The method of claim 1, wherein the liner is substantially conformal to the exposed surface of the plurality of alternating layers.

8. The method of claim 1, wherein the blocking oxide layer, the charge trap nitride layer and the gate oxide layer are deposited by a spatial atomic layer deposition process.

9. The method of claim 1, wherein the silicon material is deposited by chemical vapor deposition, epitaxial deposition or flowable chemical vapor deposition.

10. The method of claim 1, wherein the nitride material is removed by hot phosphoric acid.

11. The method of claim 1, wherein the silicon layers are removed by potassium hydroxide.

12. The method of claim 1, further comprising depositing a barrier layer on the layers of oxide material after the silicon layers are removed.

13. The method of claim 12, wherein the barrier layer is deposited by atomic layer deposition.

14. The method of claim 12, wherein the barrier layer comprises titanium nitride.

15. The device formed by the method of claim 1.

16. A method for reducing interfacial SiON in 3D NAND devices, the method comprising:
forming a plurality of alternating layers of a nitride material and an oxide material by a cycle comprising:
depositing a nitride material layer;
depositing a first layer of silicon material directly on the nitride material layer;
depositing an oxide material layer directly on the first layer of silicon material; and
depositing a second layer of silicon material directly on the oxide material layer;
repeating the cycle to form a predetermined number of layers; and
forming a 3D NAND device.

17. The method of claim 16, wherein forming the 3D NAND device comprises:
etching a memory hole through the plurality of alternating layers;
depositing a blocking oxide layer, a charge trap nitride layer and a gate oxide layer in the memory hole;
depositing a silicon material to fill the memory hole; and
replacing the nitride material with a metal gate material.

* * * * *